US012798009B2

(12) United States Patent
Yoo et al.

(10) Patent No.: US 12,798,009 B2
(45) Date of Patent: Nov. 17, 2026

(54) SYSTEM AND METHOD FOR TRANSFORMATIVE INTERFACE/SURFACE PAINTING (TRIP) FOR ARBITRARY 3D SURFACE/INTERFACE STRUCTURES

(71) Applicant: Lawrence Livermore National Security, LLC, Livermore, CA (US)

(72) Inventors: Jae Hyuck Yoo, Dublin, CA (US); Eyal Feigenbaum, Livermore, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 1186 days.

(21) Appl. No.: 17/588,795

(22) Filed: Jan. 31, 2022

(65) Prior Publication Data

US 2023/0241718 A1 Aug. 3, 2023

(51) Int. Cl.

| | |
|---|---|
| ***B23K 26/362*** | (2014.01) |
| ***B23K 26/0622*** | (2014.01) |
| ***B23K 26/08*** | (2014.01) |
| ***B23K 26/14*** | (2014.01) |
| ***B23K 26/34*** | (2014.01) |
| ***B23K 26/352*** | (2014.01) |
| ***C23C 16/448*** | (2006.01) |

(Continued)

(52) U.S. Cl.

CPC ........ *B23K 26/362* (2013.01); *B23K 26/0622* (2015.10); *B23K 26/083* (2013.01); *B23K 26/14* (2013.01); *B23K 26/1476* (2013.01); *B23K 26/34* (2013.01); *B23K 26/352* (2015.10); *C23C 16/4488* (2013.01); *C23C 16/455* (2013.01); *B23K 2101/34* (2018.08); *C23C 14/08* (2013.01)

(58) Field of Classification Search

CPC .. B23K 26/14; B23K 26/362; B23K 26/0622; B23K 26/083; B23K 26/1476; B23K 26/34; B23K 26/352; B23K 2101/34; C23C 16/0263; C23C 16/483; C23C 18/182; C23C 18/1868; C23C 18/204; C23C 16/4488; C23C 16/455; C23C 14/08

See application file for complete search history.

(56) References Cited

U.S. PATENT DOCUMENTS 4,229,232 A * 10/1980 Kirkpatrick ............ C23C 10/28 117/9
4,844,774 A * 7/1989 Sekine .................. H01L 21/312 257/E21.252

(Continued)

FOREIGN PATENT DOCUMENTS

WO WO-2017011089 A1 1/2017

OTHER PUBLICATIONS

International Search Report and Written Opinion, International Application No. PCT/US2022/049679, mailed Apr. 7, 2023.

(Continued)

*Primary Examiner* — Erwin J Wunderlich
(74) *Attorney, Agent, or Firm* — HARNESS, DICKEY & PIERCE, P.L.C.

(57) ABSTRACT

The present disclosure relates a method for forming a second material from a first material. The method involves providing a first material having a surface, and irradiating the surface with a heating beam. The surface is also exposed to a flow of reactant while the surface is being heated with the heating beam. This transforms at least a portion of the surface into a second, transformed material different from the first material.

20 Claims, 6 Drawing Sheets

(51) Int. Cl.

| | |
|---|---|
| ***C23C 16/455*** | (2006.01) |
| *B23K 101/34* | (2006.01) |
| *C23C 14/08* | (2006.01) |

(56) References Cited

U.S. PATENT DOCUMENTS

| | | | | |
|---|---|---|---|---|
| 4,962,057 | A * | 10/1990 | Epler | H10P 34/42 148/DIG. 71 |
| 7,437,047 | B2 * | 10/2008 | Bryan | G02B 6/13 438/37 |
| 7,642,205 | B2 * | 1/2010 | Timans | H10P 72/0436 438/795 |
| 8,367,971 | B2 * | 2/2013 | Koops | B23K 26/40 219/121.73 |
| 8,673,407 | B2 * | 3/2014 | Bi | H01S 3/0632 427/586 |
| 9,939,579 | B2 * | 4/2018 | Bryan | G02B 6/132 |
| 2009/0181552 | A1 * | 7/2009 | Shimomura | B23K 26/702 438/795 |
| 2010/0143744 | A1 * | 6/2010 | Gupta | H10F 77/70 438/57 |
| 2015/0034596 | A1 * | 2/2015 | Elhadj | B23K 35/38 156/345.33 |
| 2015/0140721 | A1 | 5/2015 | Moslehi et al. | |
| 2016/0010212 | A1 * | 1/2016 | Dubost | C23C 14/562 118/712 |
| 2017/0051388 | A1 | 2/2017 | Abbott et al. | |
| 2021/0226014 | A1 | 7/2021 | Zakar | |
| 2021/0272810 | A1 | 9/2021 | Arima et al. | |
| 2023/0154747 | A1 * | 5/2023 | Oezyilmaz | C23C 16/483 257/76 |
| 2023/0218003 | A1 * | 7/2023 | Lv | A24F 40/44 131/329 |
| 2025/0290199 | A1 * | 9/2025 | Mannhart | C23C 14/083 |

OTHER PUBLICATIONS

Wautelet, M. and Hanus, F. "Thickness-dependent kinetics of laser-induced oxidation of thin copper films", Appl. Phys. Lett. 58, 1355 (1991); https://doi.org/10.1063/1.104306.

Guo, Chuan Fei et al. "Grayscale photomask fabricated by laser direct writing in metallic nano-films", Optics Express 19981, vol. 17, No. 22, Oct. 26, 2009.

Qarehbaghi, Reza, et al. "Bimetallic grayscale photomasks written using flat-top beam vs. Gaussian beam", Proc. SPIE 8243, Laser Applications in Microelectronic and Optoelectronic Manufacturing (LAMOM) XVII, 824305 (Feb. 17, 2012); doi: 10.1117/12.909543.

Wang, Yongsheng et al. "$TiO_2$ micro-devices fabricated by laser direct writing", Optics Express 17390, vol. 19, No. 18, Aug. 29, 2011.

Wang, Yongsheng et al. "Path-directed and maskless fabrication of ordered $TiO_2$ nanoribbons", Nanoscale, No. 4, 2012, pp. 1545-1548.

* cited by examiner

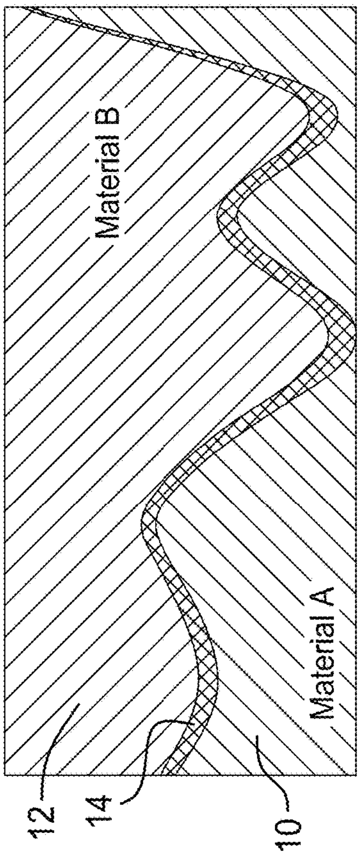
FIG. 1a1
| A | B | n @ 1w |
|---|---|---|
| Al | $Al_2O_3$ | 1.75 |
| Si | $SiO_2$ | 1.45 |
| Cu | $Cu_2O$ | 2.26 |
| Ti | $TiO_2$ | 2.3 |
| Al | AlN | |
FIG. 1a2
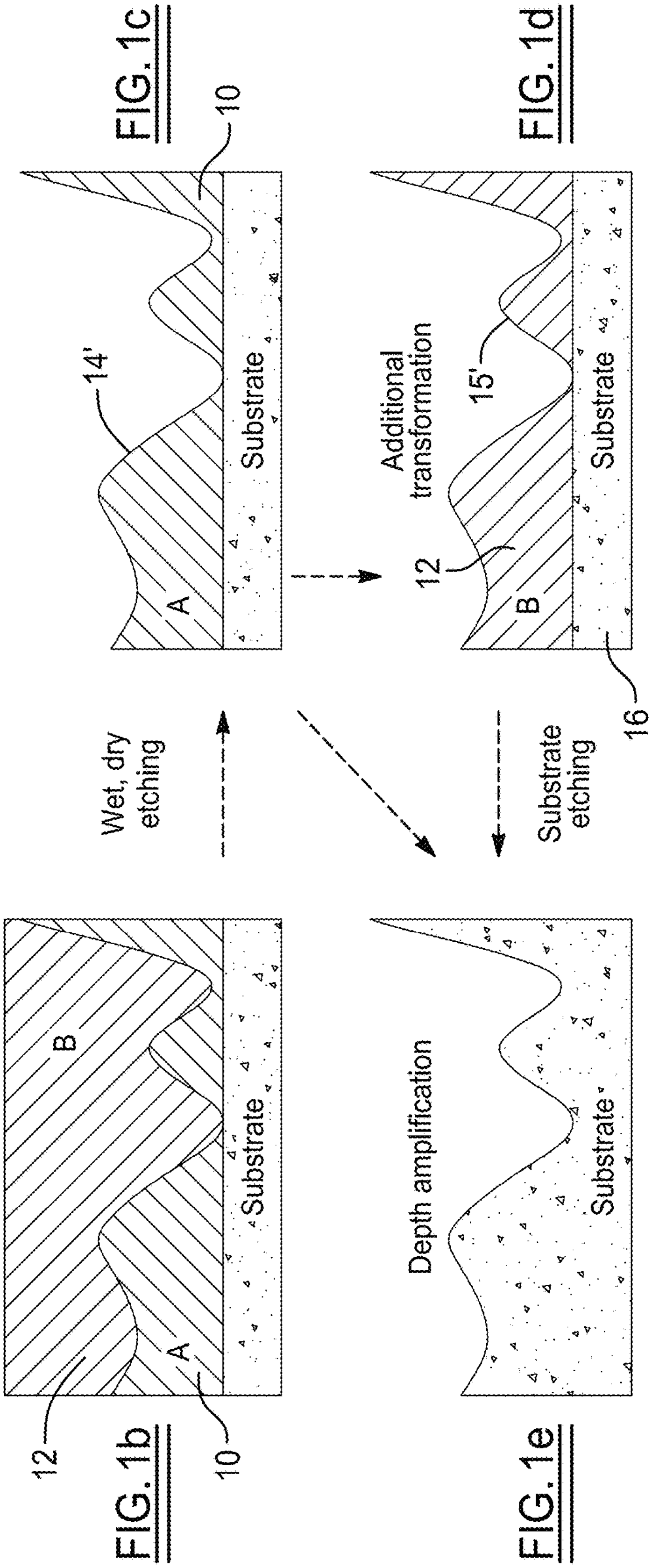
FIG. 1b
FIG. 1c
FIG. 1d
FIG. 1e

SYSTEM AND METHOD FOR TRANSFORMATIVE INTERFACE/SURFACE PAINTING (TRIP) FOR ARBITRARY 3D SURFACE/INTERFACE STRUCTURES

FEDERALLY SPONSORED RESEARCH OR DEVELOPMENT

This invention was made with Government support under Contract No. DE-AC52-07NA27344 awarded by the United States Department of Energy. The Government has certain rights in the invention.

FIELD

The present disclosure relates to systems and methods for manufacturing 3D surface/interface structures, and more particularly to systems and methods which use transformative interface/surface painting to transform portions, or all of, a first material into a second material different from the first material, and thus to create a scalable approach to constructing arbitrary 3D surface/interface structures.

BACKGROUND

The statements in this section merely provide background information related to the present disclosure and may not constitute prior art.

Laser-induced oxidation is a classical topic in laser research, which has been studied for more than 30 years. Mostly, fundamental science has been the mainstream of the research into laser-induced oxidation. Recently, laser-induced oxidation of metal film has been performed to demonstrate grayscale photomasks from which 3D structured photoresists were developed. However, the idea that the transformation is a highly effective way to manufacture sensors (or functional devices) has not been demonstrated as of yet.

For example, a 30 nm thin metal film (e.g., Cu) can be spatially transformed into a semiconductor (e.g., Cu2O, CuO) on a flexible film. The flexible (and therefore, wearable) metal-semiconductor-metal (MSM) device was checked for its response to external light events, where its photodetection capability was experimentally confirmed.

Laser-induced oxidation with etching has also been demonstrated in previous art. However, the very important feature of implementing a scalable way to manufacture patterns of target material with arbitrary surface height profiles, and with a level of nano precision, is missing. This would likely be because most device fabrication techniques practiced prior till the 2021 time frame are lithography based, where 2D patterns (with a fixed thickness) are the typical convention.

In general, it will be appreciated then that 2D patterns with varied height profile, which may be termed "pseudo 3D", are not straightforward to manufacture using existing systems and methods.

SUMMARY

This section provides a general summary of the disclosure, and is not a comprehensive disclosure of its full scope or all of its features.

In one aspect the present disclosure relates to a method for forming a second material from a first material. The method may comprise providing a first material having a surface, irradiating the surface with a heating beam, and exposing the surface to a flow of reactant while the surface is being heated with the heating beam. This transforms at least a portion of the surface into a second, transformed material different from the first material.

In another aspect the present disclosure relates to a method for forming a second, transformed material from a first material. The method may comprise providing a first material having a surface, irradiating a select surface area portion of a surface of the first material with a laser beam, and simultaneously with the irradiating the surface with the laser beam, directing a flowing stream of reactant to the select surface area portion while the select surface area portion is being heated with the laser beam. This transforms at least a portion of the surface of the first material into the second, transformed material which is different from the first material.

In still another aspect the present disclosure relates to a system for forming transforming a first material into a second material which is different from the first material. The system may comprise a heating subsystem configured to direct a heating beam to a select surface area portion of the first material. A reactant source/reservoir may be included which is configured to provide a supply of a reactant. A nozzle may also be included which is configured for focusing the reactant into a focused stream of reactant, and passing the heating beam through the nozzle generally coaxial with the focused stream of reactant, to cause both the heating beam and the flowing stream of reactant to impinge the select surface area portion of the first material. The heating beam and the reactant operate to cause a transformation of the first material into the second material.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

FIG. **1*a*1** shows a simplified high level schematic showing a first operation in transforming a host material into a new transformed material without requiring an additional deposition step;

Figure 2:
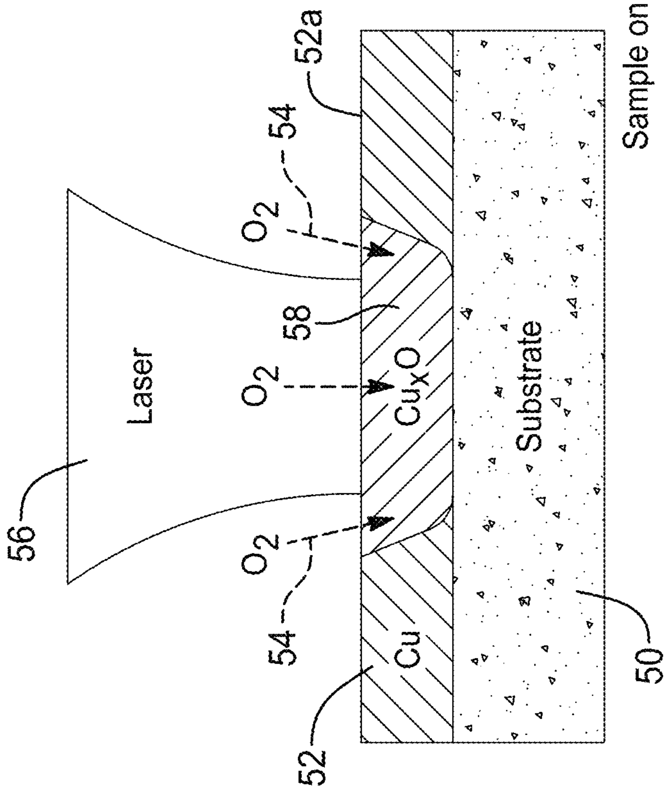
Figure 3:
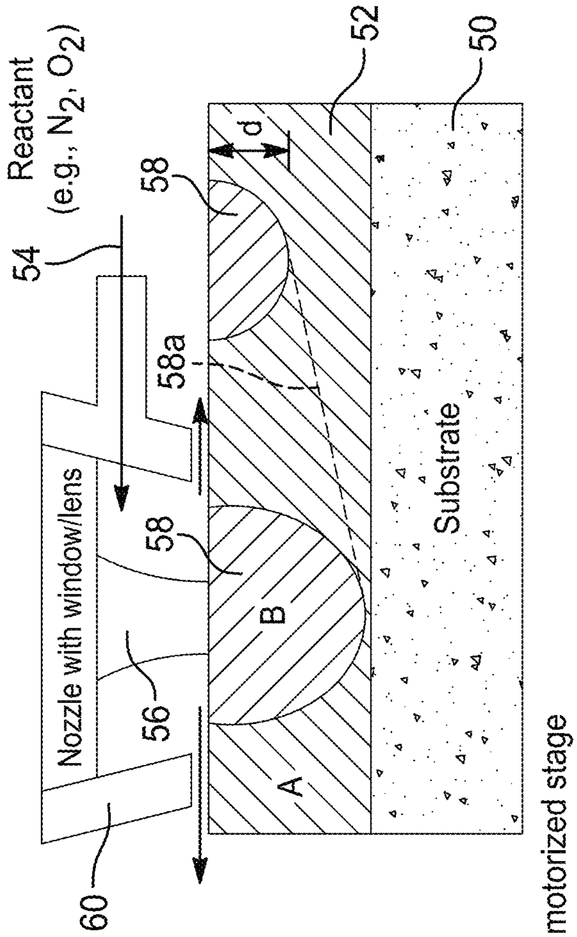
Figure 4:
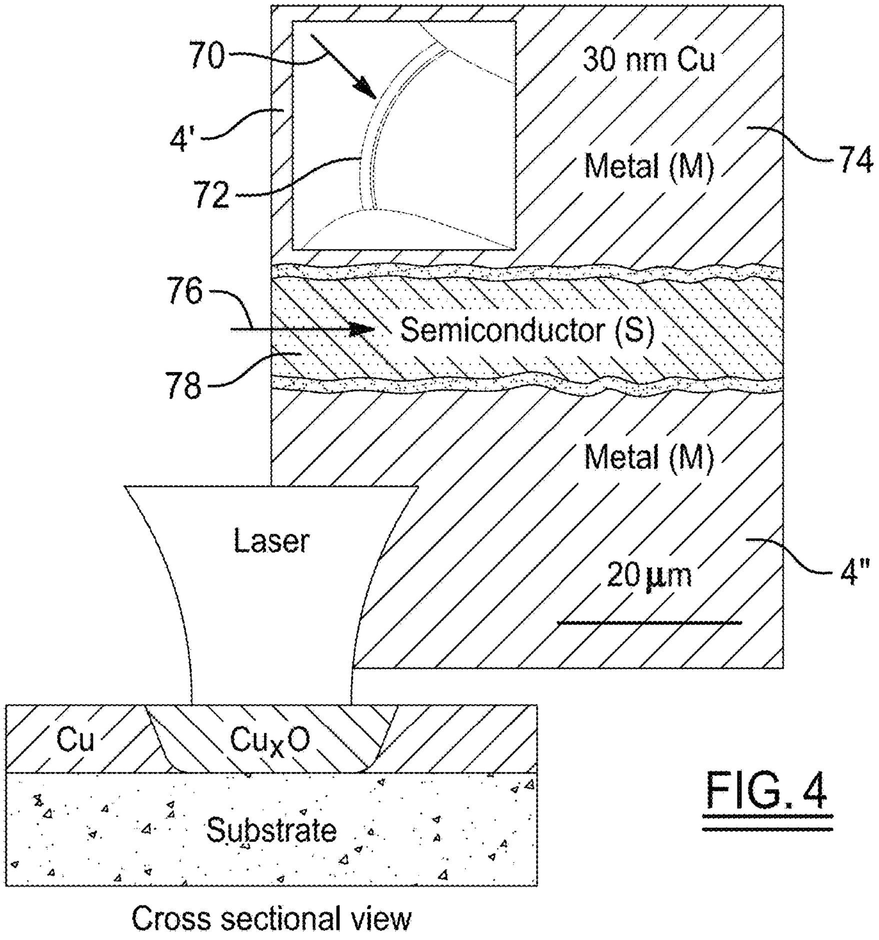
Figure 5:
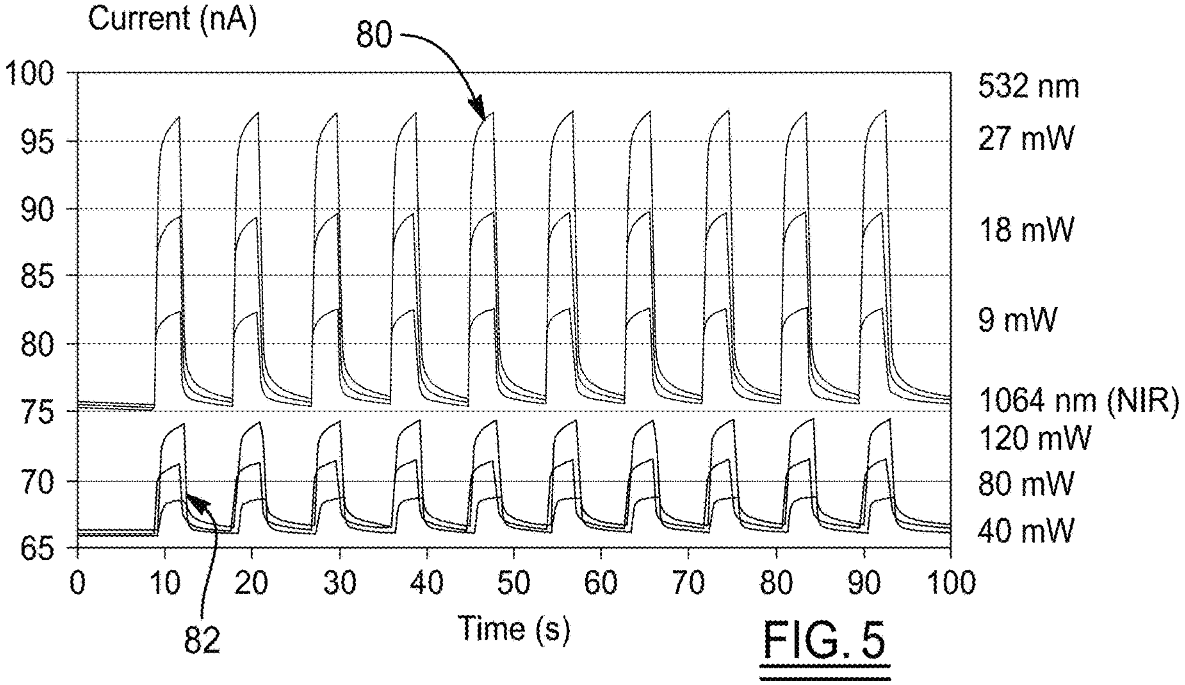
Figure 6A:
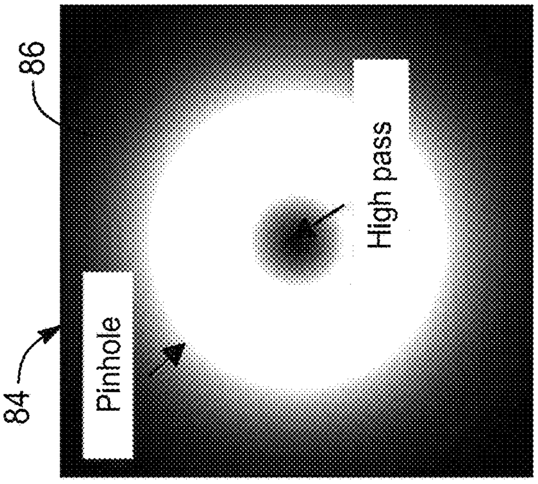
Figure 6B:
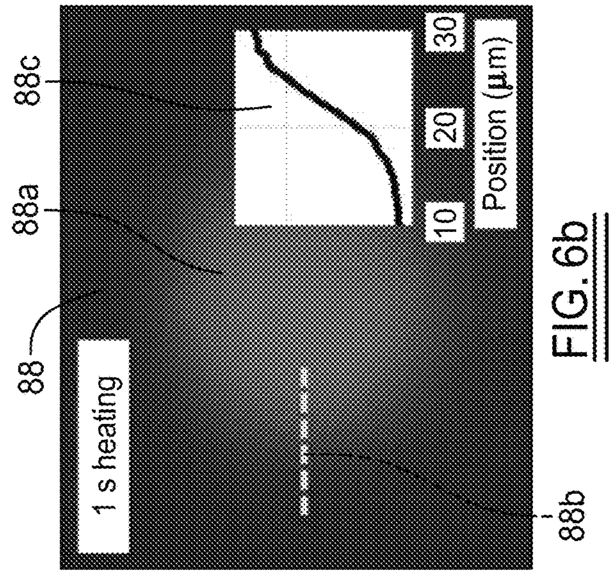
Figure 6C:
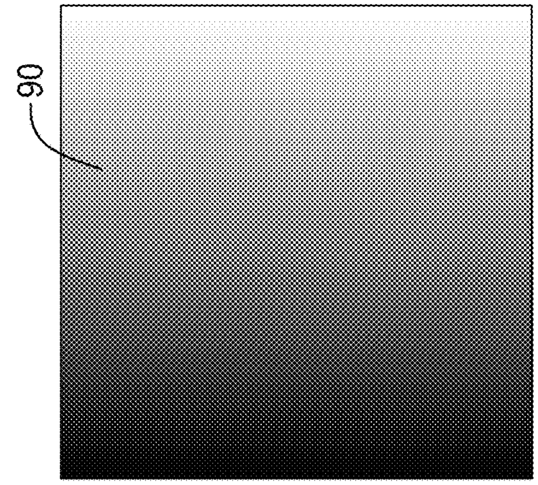
Figure 6D:
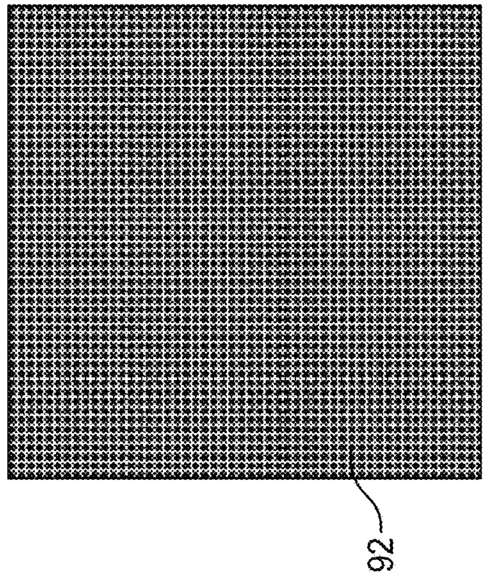
Figure 6E:
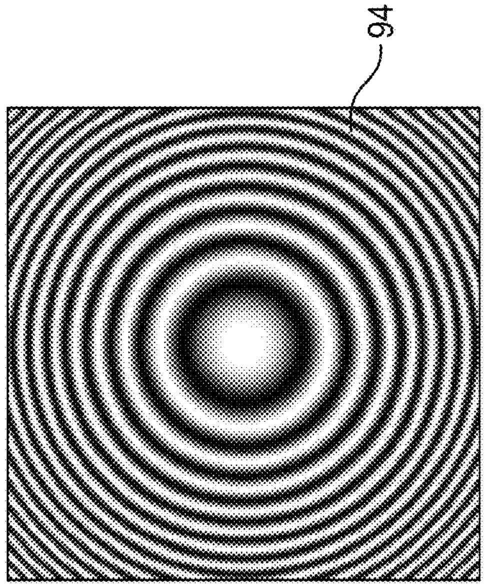
Figure 7:
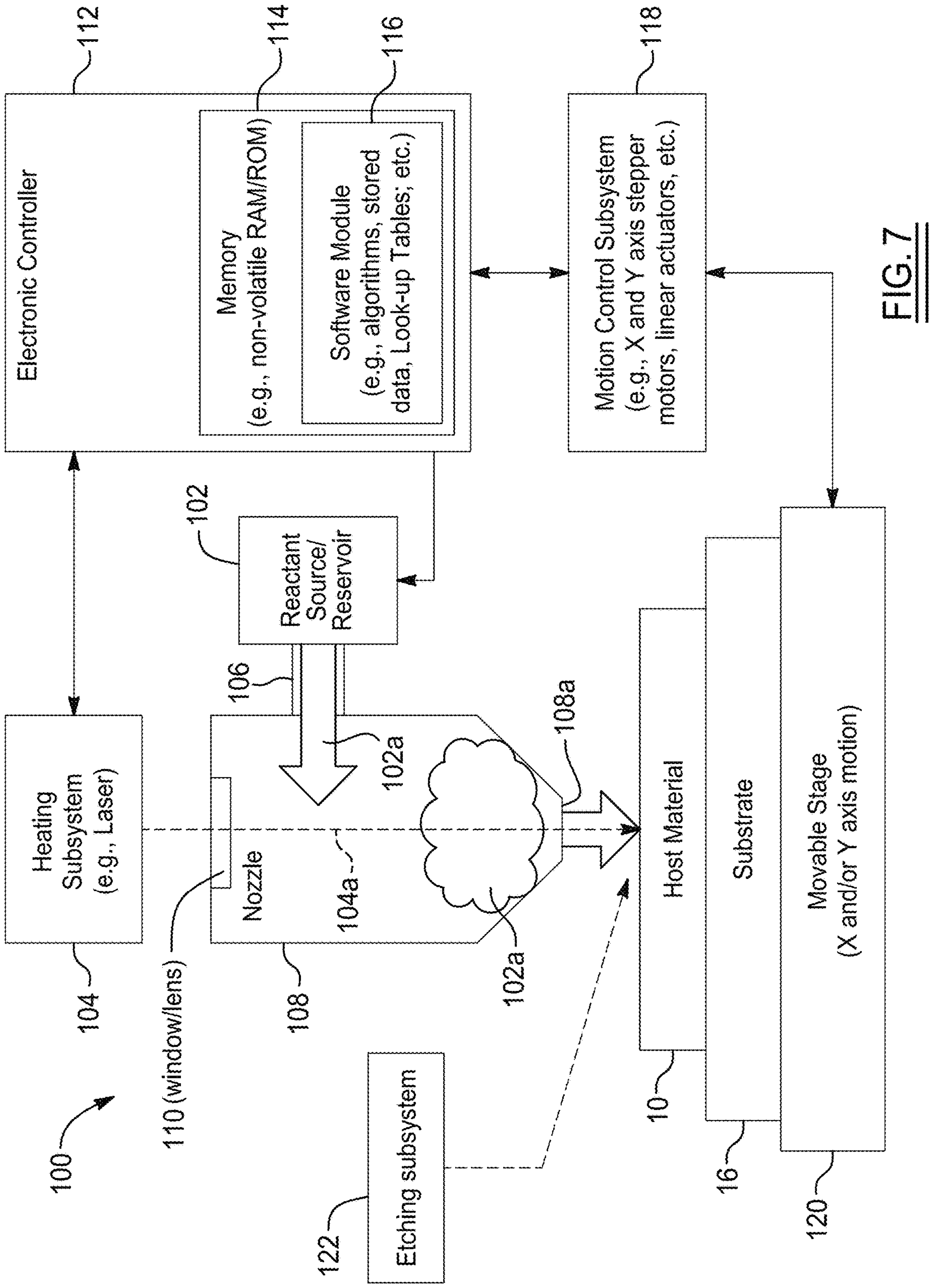
Figure 8:
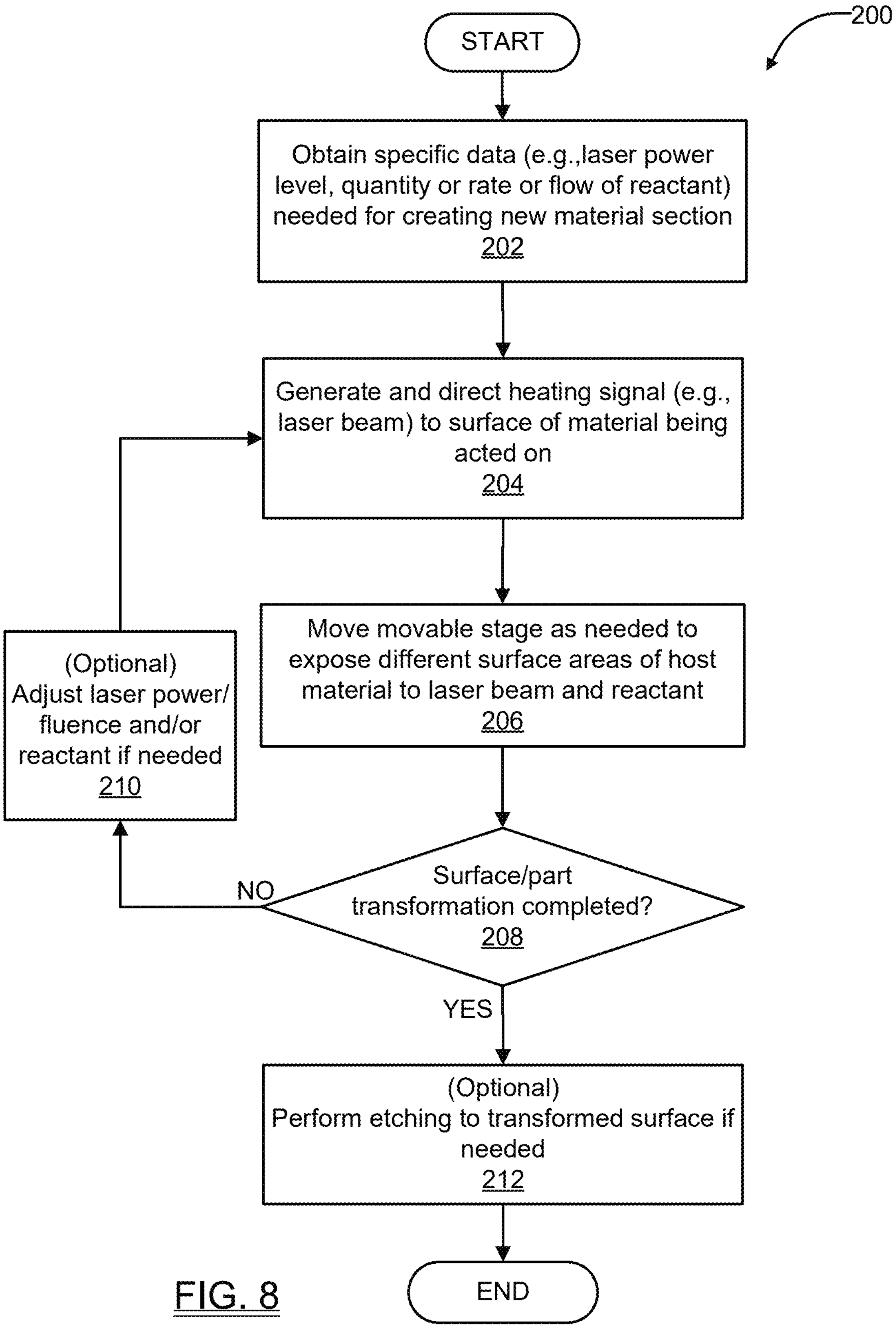

FIG. **1*a*2** is a chart illustrating a host material, its transformed material, and the refractive index of the transformed material;

FIGS. **1*b*-*e*** show additional operations that may be performed on the transformed material including wet or dry etching;

FIG. 2 is a simplified side view diagram shown how a laser may be used along with a reactant (e.g., oxygen in air) directed to a localized surface area of a thin film host material (i.e., Cu) to create a localized transformed material $Cu_xO$;

FIG. 3 shows a simplified side view diagram of a nozzle being moved laterally to spatially control the surface areas where a transformation of the host material is desired to occur (optionally a sample may be translated as well using suitable motorized stages);

FIG. 4 shows a micrograph of a flexible photodetector manufactured on 30 nm Cu film on a polyimide film;

FIG. 5 shows graphs illustrating a current response of the photodetector of FIG. 4 under light exposure to demonstrate the photo detecting property of the finished structure;

FIG. 6*a* shows one simulated filter example, in this example a high pass filter, that may be formed using the TRIP methodology of the present disclosure;

FIG. 6*b* shows an experimental demonstration illustrating the capability of depth control using the present invention, and more specifically of a transmissive micrograph gradient profile of 5 nm Cr film after the TRIP methodology is applied, and where the center of the micrograph can be seen to be relatively more transparent than its surrounded as-deposited area;

FIG. 6*c* show an example of a mask that may be formed using the TRIP methodology of the present disclosure, which has a linearly changing transmission profile, and which when used in the Fourier plane can be used to perform differentiation;

FIG. 6*d* shows one example of a diffractive optical element that may be formed using the TRIP methodology of the present disclosure;

FIG. 6*e* one example of a Fresnel lens with a gradient profile that may be formed using the TRIP methodology of the present disclosure;

FIG. 7 is a more detailed block diagram of various components that may be used to create spatially and temporally controlled, transformed areas of a host material in accordance with one embodiment of the present disclosure; and FIG. 8 is a flowchart illustrating high level operations that may be performed by a method in accordance with the present disclosure.

Corresponding reference numerals indicate corresponding parts throughout the several views of the drawings.

DETAILED DESCRIPTION

Example embodiments will now be described more fully with reference to the accompanying drawings.

The present disclosure relates to a scalable systems and methods to manufacture arbitrary 3D surface/interface structures with nano precision in the vertical axis/dimension. An important feature implemented by the systems and methods of the present disclosure is transformation. Transformation may be, but is not limited to, oxidation, nitridation, or carbonization. For example, when copper is heated under ambient conditions, its surface is oxidized and turned into copper oxide, where the new material (i.e., copper oxide) is developed via transformation (i.e., oxidation) without any additional except operations(s). Furthermore, the transformation forms a new way to create multiple materials without the need to carry out multiple deposition processes.

As illustrated in FIGS. 1*a*1-1*e*, the system and method of the present disclosure relates to a new manufacturing strategy to transform material of interest 10 (host material, labelled "A") to transformed material 12 (material labelled "B"). During this transformation step, at least a portion of the host material 10 is turned into the new transformed material 12, as an interface area 14 is introduced in FIG. 1*a*1. Since the interface 14 height/depth can be designed as needed by controlling the transformation process, the transformative strategy is to paint/draw the interface 14 "on demand" in the host material 10 while creating the transformed material 12 from a portion of the host material 10 without any additional deposition step. It will be appreciated that the interface area 14 is an area which may be made up of a mixture of the host material 10 and the new material 12, or put differently, a limited interface layer where the transformation to the new material has not been fully completed, or it may be a sharp transition between the materials 10 and 12 boundary. In most instances, the interface 14 will have an extremely small dimension and may be difficult to test for.

The transformation may be, without limitation, oxidation, nitridation, or carbonization. For example, when copper is heated under the ambient conditions, its surface is oxidized and is turned into copper oxide, where a new material (e.g., copper oxide) is developed via transformation (e.g., oxidation) without any additional deposition step, but rather strictly via the transformation step. Furthermore, the transformation can be regarded as a unique way to create multiple materials without any separate, additional processes being performed. As one example, two different types of copper oxide, for example Cu2O and CuO2, can be selectively obtained from copper by controlling the oxidation condition.

This novel method is not limited to use with just copper, but rather can be applied to most of the materials found in the periodic table. As one example, the host material 10 and its transformed material 12 pair are listed in the table of FIG. 1*a*2, with the refractive index of the transformed material in the right-most column.

Typically, the transformed material 12 will have distinctive properties (e.g., electrical, optical, chemical, etc.) different from its host material 10. This extends the strategy (transformative interface painting or "TRIP") further to extended-TRIP ("E-TRIP"), where the transformed material 12 or the host material 10 can be selectively removed by etching, for example by wet etching or dry etching, as illustrated in FIGS. 1*b* and 1*c*. This enables a new, slightly modified surface contour 14' or surface configuration to be created, as shown in FIG. 1*c*, using the new transformed material 12. Alternatively the new surface contour 14' may be formed by completely etching away only select portions of the new transformed material 12, which exposes select surface portions of the host material 10. In other words, E-TRIP may be used to design a new surface with an arbitrary thickness profile and/or contour and/or configuration using just the new transformed material 12 on the host material 10, or using portions of the new transformed material and the host material. If additional transformation is performed on the host material 10 shown in FIG. 1*c*, then a greater thickness of the transformed material 12, but with the same surface contour as the underlying host material, is obtained, as indicated in FIG. 1*d*. FIG. 1*d* shows the new transformed material 12 resting on a substrate 16 of a designated material (e.g., glass). The surface structures shown in FIGS. 1*c* and 1*d* can also be used as a substrate etching mask, as shown in FIG. 1*e*. In this instance, portions of the surface contour (e.g., contour 15' in FIG. 1*d*) are projected all the way to the upper surface of the substrate 16, and the depth of features created in the substrate 14 can be amplified (i.e., increased in depth) by the etching selectivity between the mask material (materials 10 or 12) and the substrate 16 material. So for example, if the new transformed material 12 is being used as a mask material, and the new transformed material has an etching rate of 10 times less than that of the substrate 16, then the surface contour features of the substrate 16 will be similar to those of the new transformed material, but significantly amplified in depth. Thus, TRIP may be used to design the interface 14 and E-TRIP may be used to design the surface contour/features of the final structure.

FIGS. 2 and 3 show highly simplified diagrams to further help illustrate instrumentation that may be used to help carry out the methods described herein. Typical samples which may be optimal for the methods described herein are a thin film 52 (e.g., Cu in this example) deposited on a substrate 50 as shown in FIG. 2. The thin film 52 thickness may range within a relatively wide thickness range, but in one example may be between about 1 nm to 1 μm. In many cases, the transformation is governed by reaction temperature and reactant concentration. Here, the transformation occurs as a result of a solid phase reaction, where reactant 54 (e.g., oxygen for oxidation) is delivered by diffusion through the solid surface 52*a* of the thin film 52 host material, as illustrated by the dashed arrows 54. Since the diffusion rate (or speed) rises as the temperature increases, by controlling the local temperature, the local reactant concentration in the host material 52 can be tuned. Therefore, the thin film 52 host material can be transformed in a spatially controlled fashion into a transformed material 58 with a focused laser beam 56, a suitable nozzle 60, and by using one or more motorized stages (i.e., stages movable along X and/or Y axes), as illustrated in FIG. 3. In addition, from a copper film under ambient conditions, Cu2O can be obtained at the temperature higher than 150° C. and CuO can be obtained when the temperature is greater than 300° C. As a result, by controlling the local temperature (or, local laser intensity), the target material can be selected from multiple choices including, but not limited to, Cu2O or CuO from Cu.

While there are many ways to control the temperature of the thin film 52 host material (e.g., hot plate, furnace, rapid thermal processor), however, in order to optimize the usefulness/performance of the methods described herein, localized heating of a limited portion of the thin film 52 host material is especially important. Localized heating can be implemented in different ways, but one especially controllable way is by focusing the laser beam 56, as illustrated in FIGS. 2 and 3, at designated surface areas of the thin film 52 host material. In addition, in order to perform various different types of transformation (e.g., nitridation), a particular selected reactant (e.g., NH3, N2) should be delivered. In order to perform this especially in a scalable fashion, the nozzle 60 can be implemented having a size which is compact enough so it can be fit into the gap between an objective lens and the sample surface. The objective lens is to focus the laser beam 56 for the localized heating/transformation, and therefore, the nozzle also needs to have a window for the focused laser beam delivery. The nozzle 60 can be fabricated in many ways, for example using a commercially available 3D printer.

With the nozzle 60 and the use of a movable stage for supporting the substrate for movement in the X and/or Y axes, spatially controlled transformation can be performed to create multiple transformed material portions using the thin film 52 host materials. Importantly, by controlling the transformation time at given areas of the thin film 52 host material, the transformation depth (i.e., the depth of the newly created transformed material) can be controlled as described in connection with FIG. 3. Since the diffusion speed is reasonably slow, to control the localized heating time, typical laser shutter or scanning speed control using a motorized stage can be employed, and the transformation depth (indicated by "d" in FIG. 3) can be controlled in ~1 nm resolution. In short, as shown in FIGS. 2 and 3, by spatially and temporally controlled transformation, the thin film 52 host material can be turned into targeted transformed materials 58 embedded in the thin film 52 host material with a designed arbitrary interface 58*a* in FIG. 3.

It will be appreciated then that the present disclosure describes an entirely new manufacturing systems and methods, and those skilled in this art will appreciate that a wide range of other applications are likely to be found for the systems and methods disclosed herein besides those mentioned specifically herein. However, it is expected that one particularly important application will be in forming a sensor. Sensors are devices that can detect a change in some property, for example, a change in an electrical, chemical, optical, etc., property. To detect the change, semiconductors are typically used since their properties are changed due to external stimulus. The inset portion of FIG. 4, indicated by the arrow 70, shows a photograph of a flexible photodetector 72 manufactured by the TRIP methodology described herein. The sample is a 30 nm Cu film 74 e-beam evaporated on a polyimide polymer/flexible substrate. When the sample is rastered by a beam from a 532 nm continuous wave (CW) laser (indicated by the arrow 76) under ambient conditions, the metallic copper is transformed into semiconductor (Cu2O) as shown in the image portions 4' and 4" in the top view and the cross section view, where the scale bar is 20 μm in image portion 4". The 30 nm Cu portion labelled as 74, and the area 78 is Cu2O developed by the TRIP methodology of the present disclosure. Here, by rastering the laser beam 76 on the sample under an ambient condition, metal-semiconductor-metal (MSM) structure is fabricated, as indicated by image portion 4". If a typical semiconductor fabrication technique is used, two deposition operations and two lithography operations would be needed, at the least. The flexible photodetector created in the image portion 4" of FIG. 4 successfully responded to external light events as shown in the graphs of FIG. 5. Its current is measured over time and it responded as a 532 nm wavelength light beam (indicated by graph 80) and a 1064 nm wavelength light beam (indicated by graph 82) were irradiated over the flexible photodetector. The TRIP methodology described herein is expected to form a highly efficient method to manufacture MSM type sensors such as photo detectors, chemical detectors, temperature detectors, and many more.

FIGS. 6*a*-6*e* show various forms of flat optics that may be formed 0.4. Flat optics. a) filter, b) experimental demonstration of gradient profile, c) mask with linearly changing the transmission profile, d) diffractive optical element, e) Fresnel lens with gradient profile.

Flat optics examples that can be efficiently manufactured by the E-TRIP methodology described herein are displayed in FIGS. 6*a*-6*e*. Conventional optics typically have curvature and as light is transmitted through the optics, the phase of light is spatially modified, resulting in its new wave front. The phase is one of the two characteristic properties that determines light propagation. The other important property is amplitude. When the two properties (e.g., amplitude and phase) are known, light's propagation at a certain wavelength can be calculated. In other words, by modulating an amplitude and a phase of light, light propagation can be manipulated. One interesting characteristic regarding the phase is that for light, π and 3 π are the same.

FIG. 6*a* shows a flat optical filter 84 that can transmit light with a donut shape profile. The donut shaped filter is the combination of a pinhole 86 and a high pass filter in Fourier domain. When this filter 84 is placed in an imaging system, the imaging system will show only the focal plane that passes via the pinhole (also known as confocal imaging). In addition, due to the high pass filter component (e.g., blockage in the center which blocks the low frequency component, but which transmits the high frequency component), the confocal imaging will only show 'scattering' information, for example, high frequency information that is also known as dark field imaging. As a result, by having the filter 84, confocal, dark-field imaging can be achieved. The useful filter 84 can be very efficiently manufactured by the TRIP and 3-TRIP methodology described herein. In a transmission micrograph 88 (FIG. 6*b*), a 10 nm Cr film that is optically opaque is oxidized by a 532 nm CW laser beam after one section of exposure. The center region 88*a* becomes optically transparent. The transmittance intensity profile along the yellow dashed line 88*b* is shown in the inset graph 88*c*.

An Important part of the intensity profile is that the gradient profile can be developed during this TRIP and/or e-TRIP processes described herein, which also supports that the resolution in depth is very fine like, typically <1 nm, since the initial film thickness is just 10 nm and the irradiation time was one second. With a typical laser shutter, 100 ms exposure time is easily accessible and when a sample is scanned using motorized stage, the effective exposure time can be even shorter, suggesting that even finer depth resolution is accessible. In addition, by translating a sample, the dwell time (which can be considered as effected exposure time) can be also controlled. For example, if the focused beam size is 10 um and the translation speed is 1 mm/s, the dwell time will be ~10 ms (=10 um/1 mm/s). The gradient profile is essential when optical filters are made, which is also shown in FIG. 6*a*. This eliminates the ringing effect that is introduced when there is abrupt change (high frequency) in real space. The high frequency in real space introduces components spreading over all frequencies, resulting in the ringing effect. Again, the TRIP methodology described herein provides the capability to design optical amplitude filters and a linearly changing transmittance intensity profile, as shown by the transmittance intensity profile 90 shown in FIG. 6*c*. The linearly changing filter can be used to detect a wave front with even higher precision, and it does not require complicated computations that are needed in a typical wave front detector, for example a Shack Hartmann wave front detector.

FIG. 6*d* shows a diffractive optical element 92 and FIG. 6*e* shows a Fresnel lens 94, both of which can be readily manufactured using the TRIP and e-TRIP methodologies described in the present disclosure. A typical lithography system is not optimal for manufacturing these types of optical components, since a typical lithography system uses a layer-by-layer approach. With a layer-by-layer manufacturing approach, it is not easy to construct the gradient profile since the gradient profile requires a large plurality of independent layers to mimic the gradient behavior. In short, the new invention is optimal for flat optics having a gradient profile.

Finally, these flat optics can be designed using wide bandgap semiconductor materials (e.g., Al2O3, AlN, SiO2), suggesting that this method is a scalable, economic way to make flat optics with high laser damage performance. Another important point is that by employing semiconductor materials, the flat optics can be optically tunable, meaning that if grating is developed, its performance can be dynamically tuned during its operation. These two examples—flat optics with high laser damage performance and dynamically tunable flat optics, are very important examples for commercial applications.

In conclusion, the TRIP and e-TRIP systems and methods described herein enable one to manufacture components with an interface/surface having an arbitrary morphology based on the transformations and selective etching that is performed. There is a very broad choice of the materials that may be used with the systems and methods described herein, and a depth resolution of less than 1 nm can be achieved using the systems and methods described herein. This offers precise control of the interface/surface profile, which is essential for flat optics applications (e.g., filters, Fresnel lenses, diffractive optical elements, etc.). By selecting materials for a certain purpose, this invention may be optimized to manufacture a wide variety of components and devices such as, for example and without limitation, sensors, tunable flat optics, or flat optics with high laser damage performance.

Finally, the systems and methods of the present disclosure are ideally suited for forming flat optics using wide bandgap semiconductor materials (e.g., Al2O3, AlN, SiO2). Accordingly, the systems and methods of the present disclosure are scalable in an economically efficient way to make flat optics with high laser damage performance. Another important point is that by employing semiconductor materials, the flat optics made using the systems and methods described herein can be optically tunable, meaning that if a grating is developed, its performance can be dynamically tuned during its operation. These two examples—flat optics with high laser damage performance and dynamically tunable flat optics are expected to form highly important applications of the present invention.

With brief reference to FIG. 7, a system 100 is shown in accordance with one embodiment of the present disclosure which illustrates in even greater detail various subsystems that may be incorporated in carrying out the TRIP and e-TRIP methodologies of the present disclosure. The system 100 in this example includes a reactant source/reservoir 102 for supplying a quantity of a desired reactant (e.g., oxygen and air) for oxidation; ammonia for nitridation; and argon, nitrogen and hydrogen for reduction or carbonization (Cu2O can be Cu again or polymer can be transformed into carbon). A heating subsystem 104 is provided which in one example is a laser. The laser 104 may be a CW laser able to provide a laser intensity of at least between about 0.1-100 kW/cm$^2$ and/or a laser fluence of at least between about 0.1-100 mJ/cm$^2$. Alternatively, the laser 104 may be a pulsed laser. If a pulsed laser is used, the pulse width and repetition frequency will need to be selected based on the specific host material and potentially other factors as well. In either case, the spot size of a beam 104*a* supplied by the laser 104 will be selected to meet the needs of a specific manufacturing task and/or the specific host material and/or reactant being used, and it is expected that a sport size in the range of 1 um-10 mm may be suitable for specific implementations and host materials.

The reactant reservoir supplies a reactant 102*a* through a conduit or tube 106 into a nozzle 108, while the laser 104 supplies the beam 104*a* having a desired spot size through an optically transparent window 110 in the nozzle. Both the reactant 102*a* and the beam 104*a* exit through an opening 108*a* at an end of the nozzle 108 and are highly focused at, and impinge on, a spot of predetermined area on an outer surface of the host material 10.

The system 100 may further include an electronic control system 112 (including microprocessor, microcontroller, etc.) having an internal (or external) non-volatile memory 114 such as RAM, ROM, EPROM, EEPROM, DRAM, etc. The memory 114 may store one or more software modules 116 along with algorithms, and/or look-up tables and/or data needed to carry out the TRIP and e-TRIP methodologies. A motion control subsystem 118 for moving a movable stage 120 in a highly controlled manner along perpendicular the X and Y axes may also be included. The motion control subsystem 118 may make use of DC stepper motors, linear actuators or any other components capable of providing controlled, highly precise movement of the movable stage 120 in one or both of the X and Y axes. The motion control subsystem 118 and the heating subsystem 104 may be controlled in open loop fashion by the electronic controller 112, or they may be controlled in closed loop fashion, in real time, by providing feedback to the electronic controller 112 which the electronic controller uses to modify operation of the heating subsystem 104 and/or the motion control subsystem 118 during operation. Optionally, the movable stage 120 may instead be a stationary stage, and the laser 104, the nozzle 108 and the reactant source/reservoir 102 may mounted on a common frame or stage, which is then moved to cause simultaneous movement of each of the laser, the nozzle and the reactant source/reservoir. Both implementations are envisioned, although it is expected that from a practical standpoint, incorporating the movable stage 120 will be more preferred for most application and possibly less complex to implement. An etching subsystem (e.g., wet etching or dry etching) 122 may also be included to perform one or more etching operations on the transformed material. The etching subsystem 122 will typically be a separate, stand-alone system, but for convenience has been illustrated in FIG. 7 as part of the overall system 100.

Referring now to FIG. 8, a high level flowchart 200 is shown which sets forth one example of a sequence of operations that may be performed in accordance with the present disclosure. Initially at operation 202 the data needed to form the transformed material is obtained from the memory 114 by the electronic controller 112. The laser 104 is controlled to generate the laser beam 104*a*, and the reactant reservoir 102 is controlled to release the reactant at a desired flow rate (e.g., by controlled opening of proportional, electronically controlled valve), and such that the laser beam and the flow of the reactant being released are in accordance with one another (i.e., spatially aligned on the surface being transformed) and track along the X and/or Y axes simultaneously with one another. At operation 206, if a movable stage is being used then the movable stage is moved as needed to expose various surface portions of the host material 10 to the laser beam 104*a* and the reactant 102*a*. At operation 208 a check is made by the electronic controller 112 to determine if the transforming operation is complete over the entire desired surface area, and if not, then optional operation 210 may be performed to adjust the laser power and/or fluence, as well as the flow of the reactant, if needed, and then operations 204-208 are repeated. If the check at operation 208 produces a "Yes" answer, then an optional operation 212 of performing etching of the transformed material may be carried out, after which the manufacturing operation is complete.

In conclusion, the present disclosure invention provides systems and methods to manufacture an interface/surface with an arbitrary morphology based on the transformations. Selective etching may also be carried out on the transformed material, if needed, to form various types of sensors or components. The systems and methods described herein enable full spatial and temporal control over the formation of transformed material from the host material, and thus lend themselves well to applications where a wide variety of devices or components requiring nano-precision in the vertical dimension, as well as nano-precision in the horizontal dimension, are needed. The systems and methods of the present disclosure are suitable for use with a broad choice of materials, and the depth resolution which can be achieved in manufactured structures is less than 1 nm. This offers precise control of the interface/surface profile, which is especially important and essential for flat optics applications (e.g., filters, Fresnel lenses, diffractive optical elements, etc.). By selecting materials for a certain purpose, this invention may be optimized to manufacture sensors, tunable flat optics, or flat optics, as well as a variety of other products and components, all having high laser damage performance.

The present disclosure thus relates to a unique manufacturing system and method by which a wide range of components and devices can be manufactured with low cost and/or improved performance. Such components and devices may include, but are not limited to, deep UV photodetectors (solar-blind photodetectors), optical phase plates, Fresnel lenses with high laser damage performance; flexible (or wearable) sensors; and tunable flat optics.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for forming a second material from a first material, comprising:
- providing the first material, the first material having a surface;
- irradiating the surface with a heating beam having a predetermined diameter; and
- exposing the surface to a flow of reactant while the surface is being heated with the heating beam, and while the surface and heating beam are moved relative to one another to produce a selected exposure time for the heating beam;
- supplying a flow of reactant to the surface;
- using a controller to control operation of the heating beam to control diffusion of the reactant by implementing a gradient profile which includes the exposure time, a diameter of the heating beam, and a desired heating depth of the first material, to spatially limit heating, and thus a transformation of the first material, to the desired heating depth; and
- using the flow of reactant and the heating beam to transform at least a portion of the surface into the second material in accordance with the beam diameter, the second material being transformed material different from the first material and having a depth dependent on the selected exposure time.

2. The method of claim 1, wherein irradiating the surface with the heating beam comprises irradiating the surface with a laser beam.

3. The method of claim 2, wherein irradiating the surface with the laser beam comprises irradiating the surface with a laser beam generated by a continuous wave laser.

4. The method of claim 2, wherein irradiating the surface with the laser beam comprises irradiating the surface with a laser beam generated by a pulsed laser.

5. The method of claim 1, wherein exposing the surface to the flow of reactant comprises exposing the surface to a flow of air.

6. The method of claim 1, wherein providing the first material comprises providing at least one of Cu, Ti, Cr, or Al.

7. The method of claim 1, wherein irradiating the surface with the heating beam comprises using a laser to generate a laser beam, and moving a movable stage supporting the first material along at least one of X or Y axes to heat different areas of the surface, while simultaneously exposing the surface to the reactant.

8. The method of claim 1, further comprising etching at least a portion of the second, transformed material to modify the second, transformed material.

9. A method for forming a second, transformed material from a first material, comprising:
- providing the first material, the first material having a surface;
- providing a stream of reactant;
- irradiating a select surface area portion of the surface of the first material with a heating beam formed by a laser beam;
- using a controller to control relative movement between the first material and the laser beam to produce a selected exposure time for the heating beam on the surface of the first material, to control diffusion of the stream of reactant by implementing a gradient profile which includes the exposure time, a diameter of the heating beam, and a desired heating depth of the first material, to spatially limit heating, and thus a transformation of the first material, to the desired heating depth; and
- simultaneously with the irradiating the surface with the laser beam, directing the flowing stream of reactant to the select surface area portion while the select surface area portion is being heated with the laser beam for the selected exposure time, to transform at least a portion of the surface of the first material into the second, transformed material which is different from the first material, to produce the second, transformed material in accordance with the desired depth.

10. The method of claim 9, further comprising moving at least one of the first material or both of the laser and the flowing stream of reactant, while the select surface area portion is being heated by the laser beam.

11. The method of claim 10, further comprising supporting the first material on a movable stage, and moving the movable stage along at least one of X or Y axes while the laser beam is heating the select surface area portion.

12. The method of claim 9, further comprising using the controller to help control a release of the flowing stream of reactant from a reactant source or reservoir.

13. The method of claim 9, further comprising performing an additional material removal operation to selectively remove at least a portion of the second, transformed material to create a modified, second, transformed material.

14. The method of claim 13, wherein performing the additional material removal operation comprises performing an etching operation to create the modified, second, transformed material.

15. The method of claim 14, further comprising using the laser beam to reheat a portion of the modified, second, transformed material to further modify the modified, second, transformed material.

16. A system for forming and transforming a first material into a second material which is different from the first material, the system comprising:
- a control system;
- a heating subsystem configured to direct a heating beam to a select surface area portion of the first material;

a system configured to create relative movement between the select surface area of the first material and the heating subsystem;

a reactant source or reservoir configured to provide a supply of a reactant;

the control system configured to control diffusion of the reactant by implementing a gradient profile which includes the exposure time of the heating beam, a diameter of the heating beam, and a desired heating depth of the first material, to spatially limit heating of the select surface area portion, and thus a transformation of the first material to the desired heating depth;

a nozzle configured for focusing the reactant into a focused flowing stream of reactant, and passing the heating beam through the nozzle coaxial with the focused stream of reactant, to cause both the heating beam and the flowing stream of reactant to impinge the select surface area portion of the first material for a first selected exposure time period; and the heating beam and the reactant operating to cause a transformation of the first material into the second material in accordance with the desired heating depth.

17. The system of claim 16, further comprising an etching subsystem configured to etch a portion of the second material.

18. The system of claim 16, wherein the heating subsystem comprises a laser.

19. The system of claim 18, wherein the laser comprises a continuous wave laser.

20. The system of claim 18, wherein the laser comprises a pulse laser.

* * * * *